United States Patent
Fujita

(10) Patent No.: US 8,716,805 B2
(45) Date of Patent: May 6, 2014

(54) CMOS INTEGRATED CIRCUITS WITH BONDED LAYERS CONTAINING FUNCTIONAL ELECTRONIC DEVICES

(75) Inventor: Shinobu Fujita, Tokyo (JP)

(73) Assignee: Toshiba America Research, Inc., San Jose, CA (US)

( * ) Notice: Subject to any disclaimer, the term of this patent is extended or adjusted under 35 U.S.C. 154(b) by 871 days.

(21) Appl. No.: 12/237,152

(22) Filed: Sep. 24, 2008

(65) Prior Publication Data

US 2009/0302394 A1 Dec. 10, 2009

Related U.S. Application Data

(60) Provisional application No. 61/060,231, filed on Jun. 10, 2008.

(51) Int. Cl.
*H01L 27/00* (2006.01)
(52) U.S. Cl.
USPC ................................. 257/369; 257/E27.001
(58) Field of Classification Search
None
See application file for complete search history.

(56) References Cited

U.S. PATENT DOCUMENTS

| | | | | |
|---|---|---|---|---|
| 6,174,737 B1* | 1/2001 | Durlam et al. | | 438/3 |
| 6,806,524 B2* | 10/2004 | Ooishi | | 257/295 |
| 6,958,502 B2* | 10/2005 | Lu | | 257/295 |
| 7,405,420 B1* | 7/2008 | Wong et al. | | 257/4 |
| 7,824,946 B1* | 11/2010 | Carter et al. | | 438/52 |
| 7,915,637 B2* | 3/2011 | Ghenciu et al. | | 257/109 |
| 8,477,529 B2* | 7/2013 | Keshtbod et al. | | 365/158 |
| 2004/0174732 A1* | 9/2004 | Morimoto | | 365/148 |
| 2006/0169972 A1* | 8/2006 | Furukawa et al. | | 257/20 |
| 2006/0197115 A1* | 9/2006 | Toda | | 257/248 |
| 2006/0249726 A1* | 11/2006 | Choi et al. | | 257/9 |
| 2010/0221888 A1* | 9/2010 | Ho | | 438/382 |

* cited by examiner

*Primary Examiner* — Benjamin Sandvik
(74) *Attorney, Agent, or Firm* — Westerman, Hattori, Daniels & Adrian, LLP

(57) ABSTRACT

A complementary metal oxide semiconductor (CMOS) circuit having integrated functional devices such as nanowires, carbon nanotubes, magnetic memory cells, phase change memory cells, ferroelectric memory cells or the like. The functional devices are integrated with the CMOS circuit. The functional devices are bonded (e.g. by direct bonding, anodic bonding, or diffusion bonding) to a top surface of the CMOS circuit. The functional devices are fabricated and processed on a carrier wafer, and an attachment layer (e.g. SiO2) is deposited over the functional devices. Then, the CMOS circuit and attachment layer are bonded. The carrier wafer is removed (e.g. by etching). The functional devices remain attached to the CMOS circuit via the attachment layer. Apertures are etched through the attachment layer to provide a path for electrical connections between the CMOS circuit and the functional devices.

18 Claims, 6 Drawing Sheets

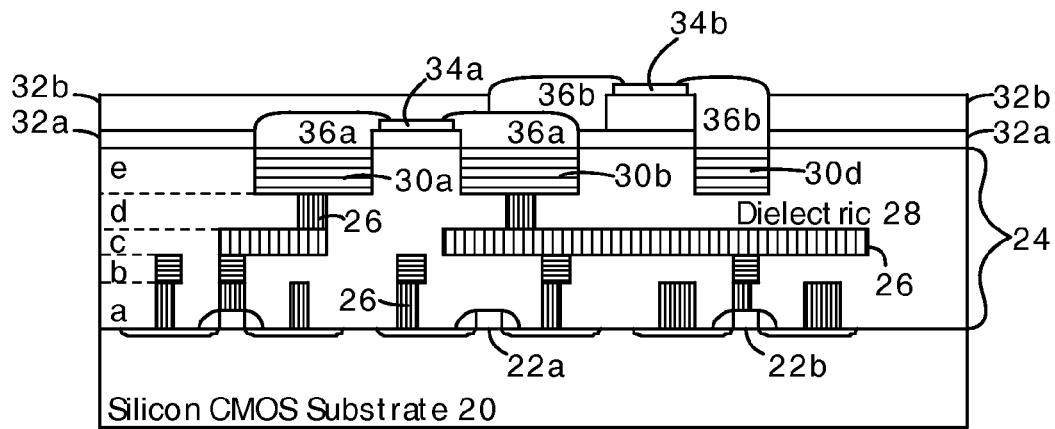
Fig. 3
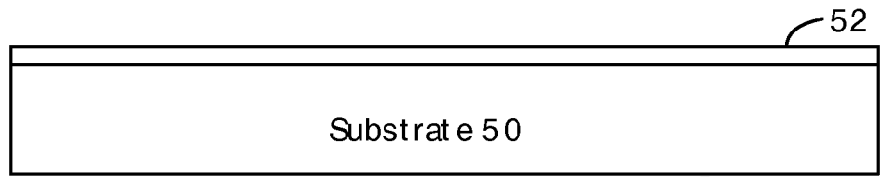
Fig. 4a
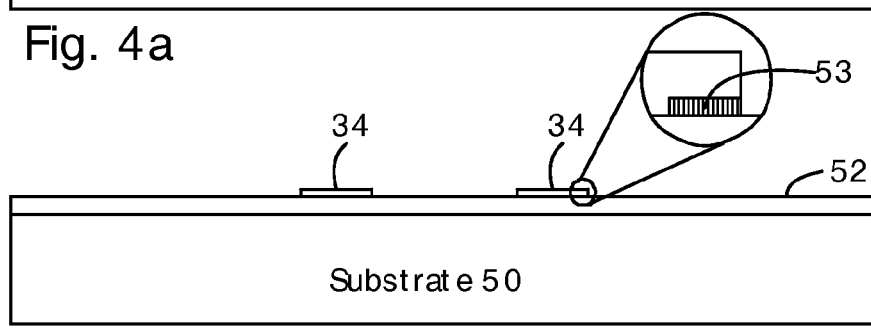
Fig. 4b   Deposit functional devices 34
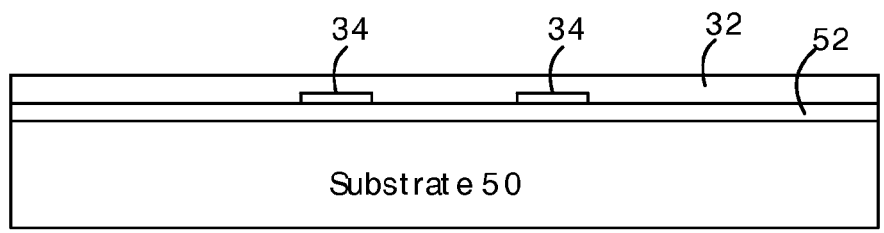
Fig. 4c   Deposit attachment layer 32

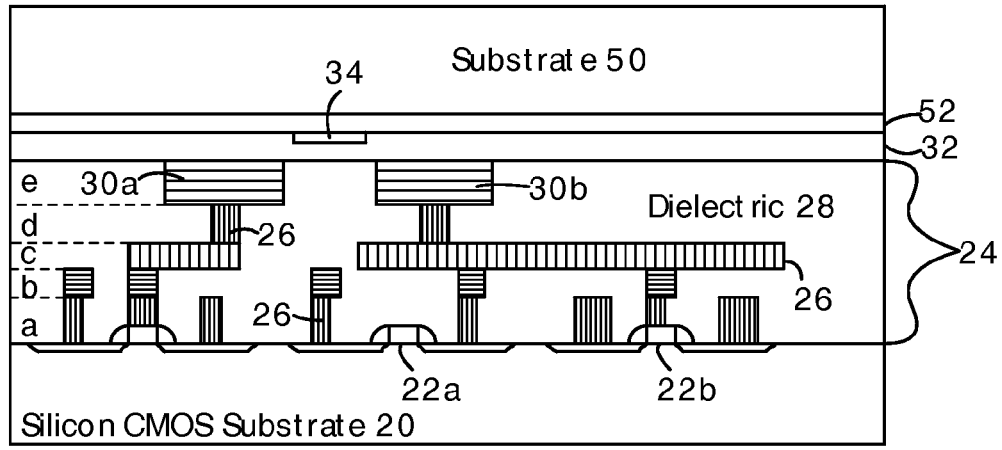
Fig. 4d  Bond the attachment layer and dielectric layer
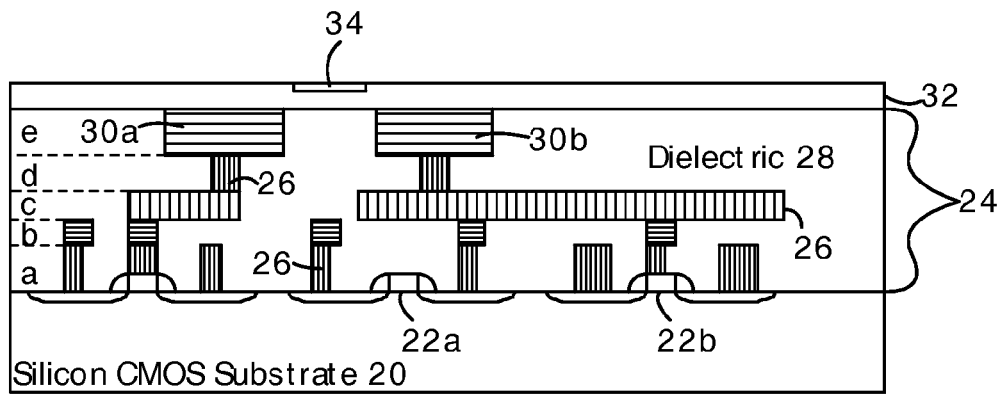
Fig. 4e  Release the carrier substrate and spacer layer
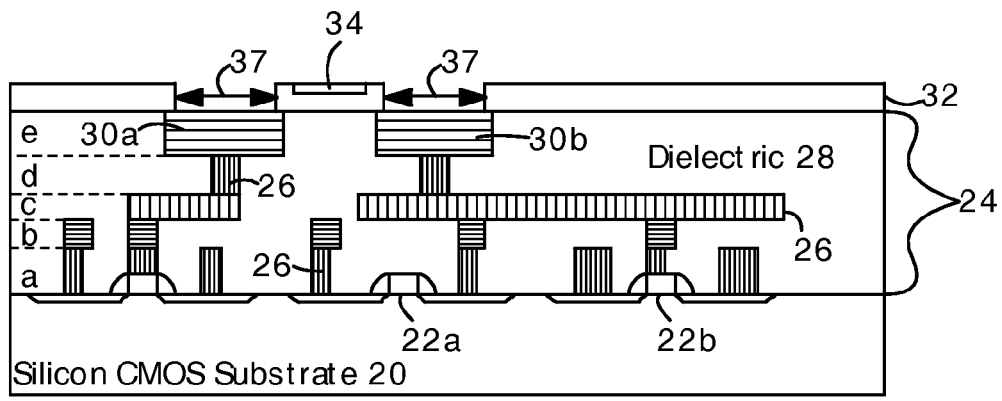
Fig. 4f  Etch attachment layer to create apertures 37

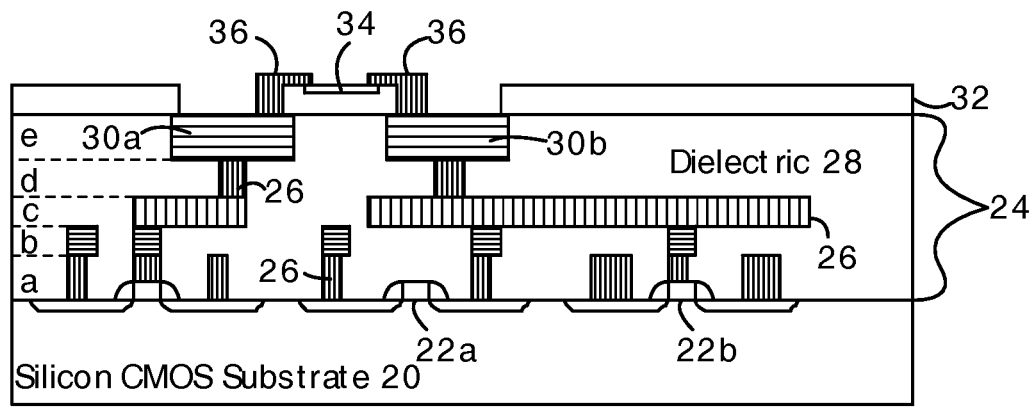
Fig. 4g  Fabricate metallizations 36
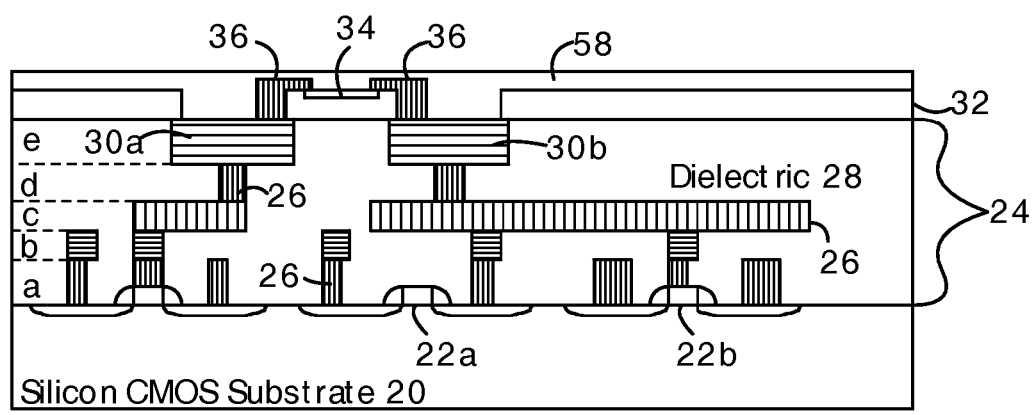
Fig. 4h  Deposit passivation layer 58

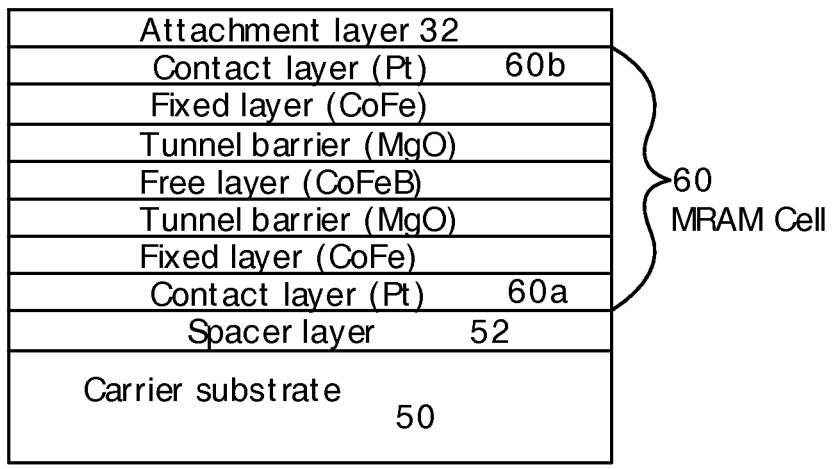
Fig. 5a Fabricate MRAM cell on carrier substrate
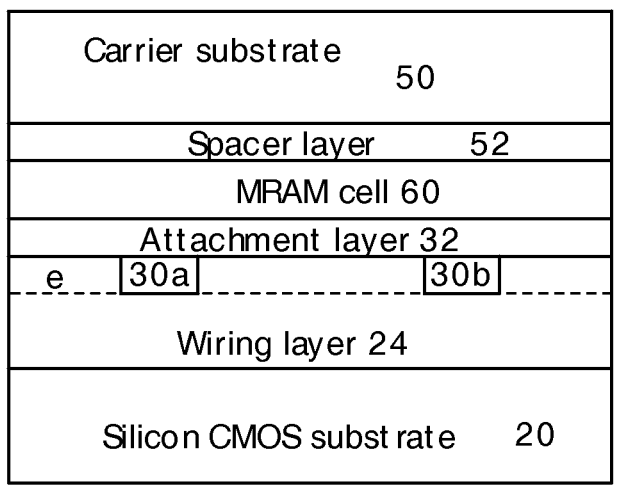
Fig. 5b Bond the attachment layer and dielectric layer
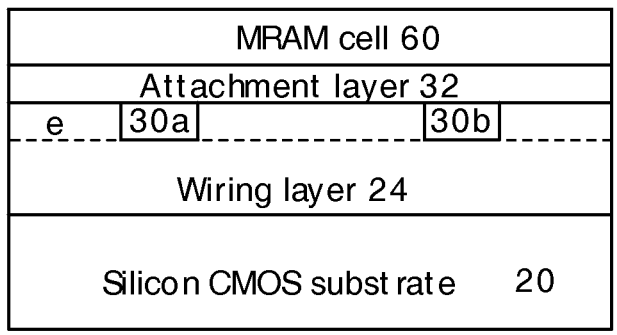
Fig. 5c Release the carrier substrate

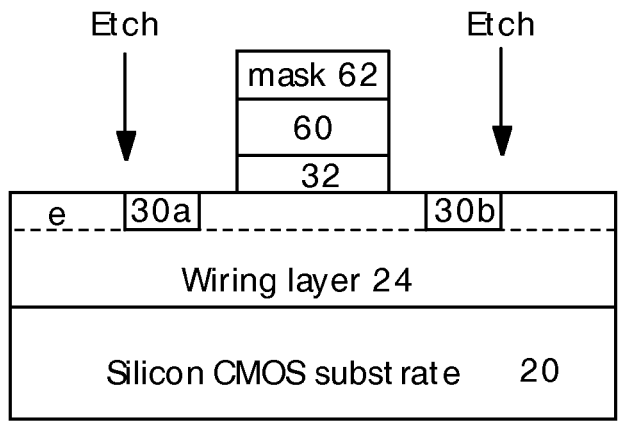
Fig. 5d  Mask and etch the MRAM cell layer 60
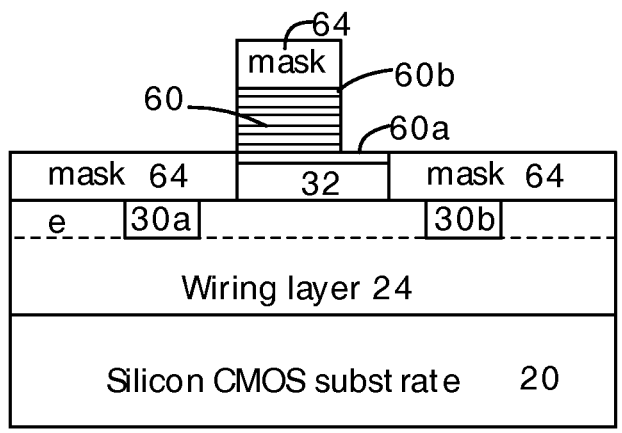
Fig. 5e  Etch MRAM cell to expose bottom contact layer
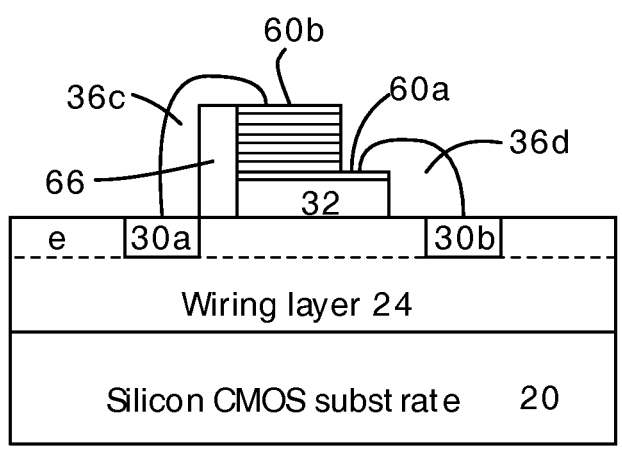
Fig. 5f  Fabricate insulator 66 and metallizations 36

CMOS INTEGRATED CIRCUITS WITH BONDED LAYERS CONTAINING FUNCTIONAL ELECTRONIC DEVICES

FIELD OF THE INVENTION

The present invention relates generally to microelectronic devices. More particularly, the preferred embodiments relate to complementary metal oxide (CMOS) circuits with integrated functional devices such as nanowires, nanotubes, phase change memory, and magnetic memory.

BACKGROUND

In recent years, novel next-generation electronic materials and devices such as carbon nanotubes, nanowires (semiconductor and metal), phase change memory (PCRAM) circuits, ferroelectric memory (FeRAM) and magnetic random access memory (MRAM) circuits (hereinafter "functional devices" or "functional materials") have attracted intense interest. These materials and devices can be used for electronic switching and amplification, chemical and environmental sensing, data storage and other applications. For example, MRAM and phase change memory may replace conventional silicon-based electrically erasable programmable memory (EEPROM) and flash memory.

In many cases it is desirable to combine these functional devices with complementary oxide semiconductor (CMOS) integrated circuits. However, there are significant barriers to integrating functional materials with CMOS processing. For example, carbon nanotubes and semiconductor nanowires typically require high temperatures for fabrication and processing. These high temperatures can damage or destroy CMOS circuits, which typically cannot tolerate temperatures above 400 C. Similarly, magnetic thin films, chalcogenide thin films and some metal oxides must be deposited at high temperatures above 400 C to achieve acceptable film quality. Hence, the temperature sensitivity of CMOS circuits precludes fabrication or deposition of these functional materials directly onto CMOS integrated circuits.

Additionally, CMOS circuits can be damaged or destroyed by contamination from metals present in functional device materials, or chemicals necessary for processing functional materials. For example, metals present in phase change materials or magnetic thin films can damage the performance of CMOS circuits if allowed to penetrate the semiconductor junction regions. Hence, integration will require reliable isolation of the CMOS devices from the functional devices. The isolation must prevent diffusion of destructive atomic species.

It would be an advance in the art of microelectronics to provide a method for integrating into CMOS circuits materials that require high temperature processing. Also, it would be an advance in the art to provide a method for integrating novel materials that will not introduce destructive contamination into CMOS circuits. Such a method could be used to create CMOS circuits with integrated functional devices such as carbon nanotubes, semiconductor nanowires, phase change materials, MRAM, PCRAM, FeRAM and magnetic thin films.

SUMMARY

Provided is a CMOS circuit with integrated functional devices. The integrated circuit has a substrate with CMOS devices, and a wiring layer disposed on the CMOS devices. The wiring layer has electrically conductive wiring, and a dielectric material filling the volume surrounding the wiring, as known in the art. A first attachment layer is bonded to the dielectric layer, and a functional device is disposed on the attachment layer. An electrical connection connected the electrical wiring and the functional device. The attachment layer and dielectric layer can be bonded by a direct bonding process, anodic bonding process, diffusion bonding process or the like.

Preferably, the attachment layer has an aperture and the electrical connection extends through the aperture.

Preferably, the attachment layer and dielectric layer are made of the same material, such as spin on glass, SiO2, silicon nitride or silicon oxynitride for example.

The integrated CMOS circuit can have a plurality of stacked layers of functional devices.

The functional device can have carbon nanotubes or nanowires, and can be a nanotube or nanowire transistor.

The functional device can also be a magnetic memory device, a phase change memory device, a ferroelectric memory device, or a resistive memory device.

Also provided is a method for making the present CMOS integrated circuit. In the present method, a CMOS circuit is fabricated. The CMOS circuit has CMOS devices, a dielectric layer on the CMOS devices, and electrical terminals in (embedded in) the dielectric layer. A functional device is fabricated on a separate carrier substrate, and then an attachment layer is deposited over the functional device. Then, the attachment layer and dielectric layer are bonded (e.g. using heat and pressure). The carrier substrate is removed (eg. By etching), leaving the attachment layer and functional device bonded to the CMOS circuit. Finally, electrical connections are fabricated connecting the functional device and wiring in the CMOS circuit.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE FIGURES

The preferred embodiments of the present invention are shown by a way of example, and not limitation, in the accompanying figures, in which:

FIG. 3 shows a cross sectional view of a CMOS circuit having two stacked layers of functional devices;

FIGS. 4a-4h illustrate a method for making a CMOS circuit with an integrated functional device; and FIGS. 5a-5f illustrate a method for making a CMOS circuit with an integrated magnetic memory cell.

DETAILED DESCRIPTION OF THE PREFERRED EMBODIMENTS

Figure 1:
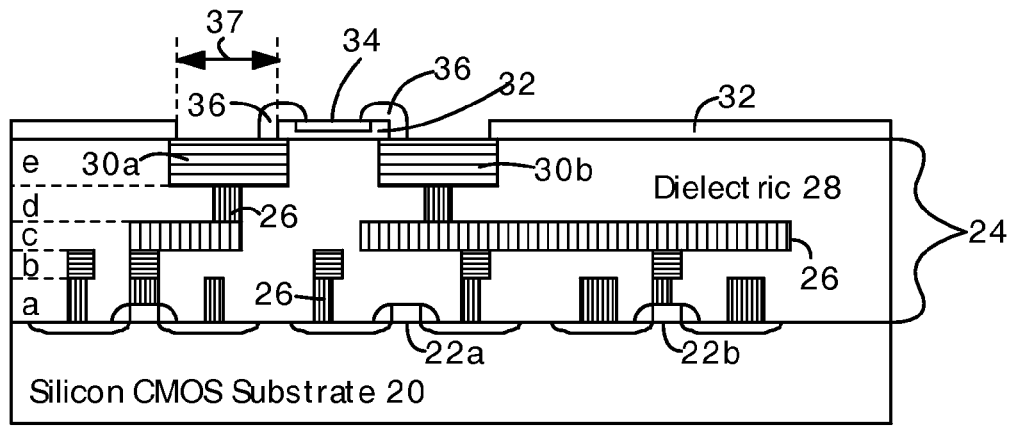
FIG. 1 shows a cross-sectional view of a CMOS circuit having integrated functional devices according to the present invention.

While the present invention may be embodied in many different forms, a number of illustrative embodiments are described herein with the understanding that the present disclosure is to be considered as providing examples of the principles of the invention and that such examples are not intended to limit the invention to preferred embodiments described herein and/or illustrated herein.

In relation to the preferred embodiments, the following terminology is employed.

Functional device: An electronic device that is not commonly integrated in CMOS circuits, and is made of materials not conventionally present in CMOS circuits. Examples of functional devices include carbon nanotubes, semiconductor nanowires, metal nanowires, phase change memory (PCRAM) devices, chalcogenide glass (e.g. films or structures), magnetic memory (MRAM) devices, ferroelectric memory (FeRAM) devices and resistive memory (RRAM) devices.

Carbon nanotube (CNT): An approximately 1-dimensional nanostructure comprising one or more coaxial graphite tubes. Carbon nanotubes in the present invention can have diameters of about 1-100 nanometers, and 1-50 graphite layers. The diameter and number of graphite layers of the carbon nanotube may vary over its length. Also, a carbon nanotube in the present transistor structure may comprise a plurality or many parallel (i.e., non-coaxial) carbon nanotubes (i.e., a nanotube 'rope').

Nanowire (NW): An approximately 1-dimensional nanostructure that may be about 1-100 microns long and 0.001-10 microns wid. Nanowires typically have an aspect ratio of about 10-1000 or more. Nanowires can be made of metals, semiconductors, ceramics, chalcogenide glasses, polymers, piezoelectrics, or any other material having useful functionality.

Phase change memory (PCRAM): A non-volatile computer memory system based on chalcogenide glasses that can be switched between crystalline and amorphous states.

Magnetic memory (MRAM): A non-volatile computer memory system that stores data in the magnetic field of microscopic magnetic elements. MRAM cells can be spin valves based on the quantum mechanical magnetoresistance effect.

Resistive memory (RRAM): A non-volatile computer memory system that stores data in a resistive thin film that changes resistance in response to electrical pulses. RRAM devices typically use metal oxide thin films (e.g. nickel, titanium or tungsten oxides) as the variable resistance structure.

Ferroelectric memory (FeRAM): A non-volatile computer memory system that stores data in electrically charged regions of a ferroelectric material.

In a preferred embodiment of the present invention, functional devices are integrated with CMOS devices by a process that does not require excessive heating of the CMOS devices, and does not pose a threat of contamination of the CMOS devices. Specifically, the functional devices are disposed on an attachment layer that is bonded to a top surface of a dielectric layer of the CMOS circuit. The attachment layer and the dielectric layer are preferably made of the same material and are preferably bonded by direct bonding. Wiring structures within the dielectric layer provide electrical connections between the CMOS devices and the functional devices. The attachment layer and functional devices are bonded to the dielectric layer after the CMOS circuit is fabricated. The functional devices are fabricated on a separate carrier substrate, so the CMOS devices are not exposed to high temperatures. In preferred embodiments of the present invention, the CMOS devices and functional devices are fabricated separately and therefore can be fabricated by incompatible methods.

FIG. 1 shows an embodiment of the present electronic device having a substrate 20 (e.g. a silicon chip) and CMOS/MOSFET devices 22a 22b fabricated on the substrate. A wiring layer 24 has electrical conductors 26 and a dielectric layer 28. The dielectric layer 28 can be made of SiO2 for example. The dielectric layer 24 can comprise sublayers a, b, c, d, e, deposited sequentially as known in the art. Electrical terminals 30a 30b are electrically connected to the electrical conductors 26. Terminals 30a 30b are the uppermost extent of the electrical conductors and are disposed within the uppermost dielectric sublayer e.

An attachment layer 32 is bonded to the uppermost sublayer e of the dielectric layer. The attachment layer 32 is preferably made of the same material as the dielectric layer 28, which can be SiO2, silicon nitride, low-K dielectrics and the like. The attachment layer 32 is made of a material that can be bonded with the dielectric layer. The attachment layer 32 and dielectric 28 (i.e. sublayer e) are attached by a direct bond, anodic bond, diffusion bond or the like.

The attachment layer 32 preferably has apertures 37 aligned with the terminals 30a 30b. The apertures 37 allow electrical connections to be made from the terminals 30a 30b to the functional device 34. The apertures 37 can be larger or smaller than the terminals 30a 30b.

The CMOS devices 22 can be conventional field effect transistors or diodes, for example.

The functional device 34 is disposed on the attachment layer 32, and is electrically connected to the terminals 30a 30b via metallizations 36. The functional device 34 is therefore in electrical communication with the CMOS devices 22a 22b.

The present CMOS circuit can have many thousands or millions of functional devices 34 integrated on a single CMOS chip, in combination with many thousands or millions of CMOS devices.

The CMOS circuit can also have a passivation layer (not shown) covering the functional device 34 and the attachment layer 32. The passivation layer can be made of SiO2 (e.g. spin on glass), silicon oxynitride, or other passivation materials known in the art. Also, the CMOS circuit can have contact pads (not shown) for electrical connections to external circuits (e.g. via a leadframe and wire bonds) as known in the art.

The electrical conductors 26 and terminals 30a 30b can be made of metals (e.g. aluminum or copper) silicide compounds or other electrically conductive materials.

The functional device 34 can be a computer memory element, sensor, actuator, switch or other electronic component.

Figure 2A:
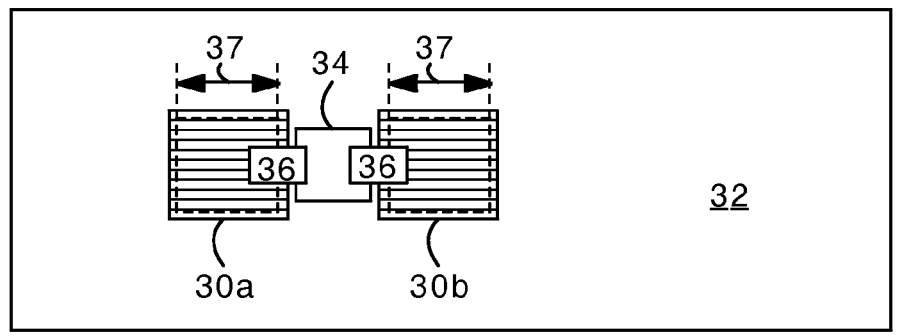
FIG. 2a shows a top view of a generic two terminal functional device according to the present invention.

FIG. 2a shows a top view of the device of FIG. 1. The functional device 34 is electrically connected between the terminals 30a 30b. Although the functional device in FIG. 2a is a two-terminal device, the invention is not so limited. Each functional device can have any number of terminals.

Figure 2B:
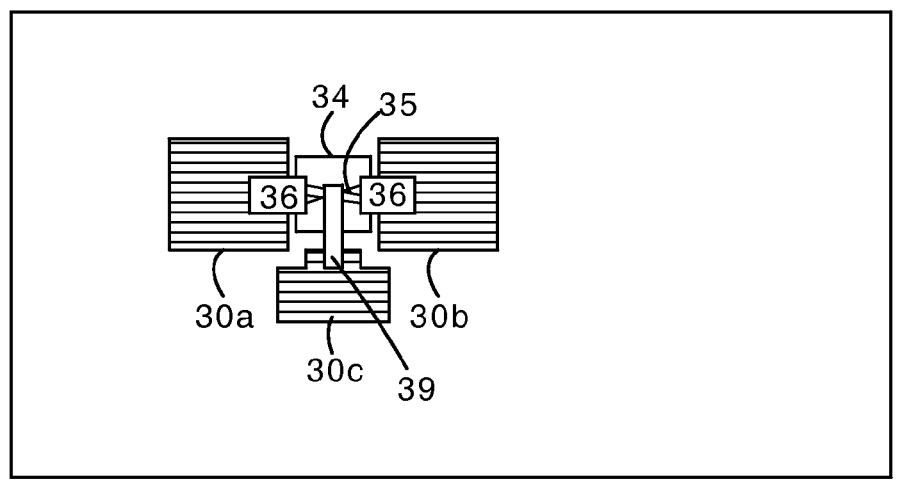
FIG. 2b shows a top view of a three terminal nanowire or carbon nanotube transistor according to the present invention.

FIG. 2b shows a top view of a three-terminal functional device according to the present invention. The functional device 34 in FIG. 2 is a nanowire or nanotube transistor. Nanowires or carbon nanotubes 35 are electrically connected between terminals 30a 30b. A gate metallization 39 is disposed over the nanowires 35 and is electrically connected to third terminal 30c.

FIG. 3 shows an embodiment having functional devices in two stacked device layers. Each "device layer" comprises an attachment layer 32 and a functional device 34. A first attachment layer 32a is disposed on the uppermost portion e of the dielectric layer 28. A second attachment layer 32b is disposed on the first attachment layer 32a. A first functional device 34a is disposed on the first attachment layer 32a and a second functional device is disposed on the second attachment layer 32b. Metallizations 36a 36b provide electrical connections between the functional devices 32a 32b and the terminals 30a 30b 30d, and the electrical conductors 26.

The 3-dimensional circuit of FIG. 3 can have many thousands or millions of functional devices 34 in each device layer, and can have 2, 3, 5, 10, 100 or more device layers.

Also, it is noted that additional layers of material can be disposed between the stacked device layers. The additional layers can be made of spin on glass for example, and can provide planarization.

It is noted that the attachment layers 32a 32b can have embedded wiring structures to provide electrical connections to the functional devices 34 in multiple stacked device layers. The wiring structures within the attachment layers 32 can comprise complex wiring interconnections that extend horizontally and in three dimensions between the device layers.

FIGS. 4a-4h Illustrate a preferred method for manufacturing the CMOS circuits with functional devices. The fabrication steps proceed as follows:

FIG. 4a: A carrier substrate 50 is provided with an optional spacer layer 52. The spacer layer can be made of SiO2, silicon nitride, silicon oxynitride, or metals for example. The substrate can be made of silicon or glass. The spacer layer can be 0.1-2 microns thick for example. The spacer layer 50 can function in subsequent steps as a release layer.

FIG. 4b: The functional devices 34 are deposited or fabricated on the spacer layer 50. This step may require high temperature processing that is damaging to conventional CMOS devices. In the case of carbon nanotubes or nanowires, they can be grown from catalyst particles in situ, or alternatively they can be deposited from a liquid suspension. There are many methods known for fabricating carbon nanotube and nanowire devices.

The functional devices 34 may have metal contact pads 53 for connecting with metallizations 36.

The functional devices 34 may comprise a film of aligned or randomly oriented nanotubes or nanowires.

The functional devices 34 may have a thickness of about 1, 5, or 10 microns. If the functional devices 34 are made of nanotubes or nanowires for example, then they may have a thickness of less than 100 or 50 nanometers.

FIG. 4c: The attachment layer is deposited over the functional devices 34. Preferably, the attachment layer is made of the same material as the uppermost sublayer e of the dielectric 28. In a preferred embodiment, the attachment layer is made of spin on glass, SiO2, silicon nitride or silicon oxynitride for example. The attachment layer can be about 0.1-2 microns thick. The attachment layer can be deposited by sputtering, chemical vapor deposition (CVD), or spin-coating, for example.

FIG. 4d: The carrier substrate 50 is aligned with a CMOS circuit and bonding is performed so that the attachment layer 32 bonds to the uppermost sublayer e. Preferably, the attachment layer 32 and sublayer e are made of the same or similar materials. Also preferably, the bonding is achieved by direct bonding. Direct bonding can be performed by simultaneously applying heat (e.g. 300 C) and pressure. Anodic bonding, diffusion bonding and other bonding methods can also be used. Many different bonding methods are possible in the present invention. Preferably, the bonding method does not require temperatures or pressures that can damage the CMOS devices. Typically, the upper temperature limit for CMOS devices is about 400 C.

In some embodiments, the sublayer e (or a partial thickness of the sublayer e) may cover the terminals 30a 30b. In this case, the attachment layer 32 will not be in contact with the terminals 30a 30b.

Also, it is noted that the attachment layer 32 and uppermost sublayer e can be made of different materials. The bonding method should be selected according to the composition of the attachment layer and sublayer e.

It is noted that the bonding step of FIG. 4d can be wafer-wafer bonding, or can be die-wafer bonding. Wafer-wafer bonding tends to be more expensive, but offers the advantage of accurate mechanical alignment between the functional devices 34 and the CMOS circuit. Die-wafer bonding is less expensive but the alignment is less accurate. If die-wafer bonding is used, then the manufacturer is free to choose whether the carrier substrate or the CMOS substrate is in die (singulated) form.

Optionally, the attachment layer 32 and the dielectric layer 28 can be planarized (e.g. by chemical mechanical polishing or spin on glass deposition) so that gaps are not present at the bond interface.

FIG. 4e: The carrier substrate 50 and spacer layer are removed, so that the functional device 34 is exposed. The carrier substrate 50 can be removed by etching it completely away. Alternatively, the spacer layer 52 can be selectively etched, which will allow the carrier substrate 50 to be reused. Other methods for removing the carrier substrate are also possible. For example, the space layer 52 can be fractured or melted.

FIG. 4f: The attachment layer 32 is etched to create apertures 37 exposing the terminals 30a 30b.

FIG. 4g: Metallizations 26 are fabricated to electrically connect the functional device 34 with the terminals 30a 30b. The metallizations 36 can be created by electrodeposition, CVD or sputtering for example. The metallizations 36 are connected to the contact pads 53 if they are present.

FIG. 4h: An optional passivation layer 58 is deposited. The passivation layer 58 can be a spin-on glass and can planarize the surface. Holes can be etched in the passivation layer 58 and attachment layer 32 to expose metal contact pads (not shown) for wire bonding and attachment to an external lead frame, as known in the art.

After the step shown in FIG. 4g or 4h, additional device layers (comprising an attachment layers and functional devices) can be stacked onto the device. The surface of the device can be planarized (e.g. by chemical mechanical polishing or spin on glass deposition) before each new device layer is bonded to the circuit FIGS. 5a-5f illustrate a specific method for integrating magnetic memory (MRAM) cells with a CMOS circuit.

FIG. 5a: An MRAM cell layer 60 is deposited on the carrier wafer, and the attachment layer 32 is deposited on top of the MRAM cell layer 60. The MRAM cell layer 60 is a multilayer stack of magnetic and insulating thin films, as known in the art. Top and bottom contact layers 60a 60b provide electrical connections to the MRAM cell.

FIG. 5b: The carrier substrate 50 is aligned with a CMOS device substrate and bonding is performed so that the attachment layer 32 bonds with the uppermost sublayer e. The bonding process can be similar to the process described in reference to FIG. 4d.

FIG. 5c: The carrier substrate 50 is removed. The carrier substrate can be removed by etching the carrier substrate or by etching the spacer layer 52. Removal of the carrier substrate can be similar to the process described in reference to FIG. 4e.

FIG. 5d: Etch mask 62 is deposited and patterned, defining areas where MRAM cell layer will be preserved. Etching (e.g. plasma etching or reactive ion etching) is performed to remove the MRAM cell layer and the attachment layer 32.

FIG. 5e: Mask 64 is deposited and patterned. A portion of the MRAM cell is etched so that bottom contact layer 60a is exposed.

FIG. 5f: Sidewall insulator 66 is deposited and metallizations 36 are fabricated. The metallizations 36 provide electrical connections between the terminals 30a 30b and the contact layers 60a 60b.

After the step of FIG. 5f, the device can be planarized. Optionally, after planarization, additional layers of MRAM cells can be bonded to the structure.

The present integrated CMOS circuits can have many applications. For example, the functional devices can be memory cells for nonvolatile data storage, or can be sensors for sensing biomolecules, chemicals, or radiation for example. The functional devices can be nanotube or nanowire transistors with unique electronic properties or switching characteristics.

BROAD SCOPE OF THE INVENTION

While illustrative embodiments of the invention have been described herein, the present invention is not limited to the various preferred embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" or "step for" (i.e., not step of) is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features.

What is claimed is:

1. A complementary metal oxide semiconductor (CMOS) circuit with integrated functional devices, comprising:
   a) a substrate having CMOS devices;
   b) a wiring layer disposed on the CMOS devices, wherein the wiring layer includes electrically conductive wiring and a dielectric layer;
   c) a first attachment layer bonded to the dielectric layer;
   d) a bottom surface of a first functional device disposed on and directly contacting the first attachment layer;
   e) an electrical connection between the electrically conductive wiring and the functional device,
   f) a metallization layer which creates the electrical connection between the electrically conductive wiring and the functional device and wherein said metallization layer is directly connected to said functional device and said electrically conductive wiring,
   wherein said metallization layer is located on top of said functional device and is also located on top of said electrically conductive wiring, and
   wherein the entire functional device is embedded within the first attachment layer.

2. The CMOS circuit of claim 1, wherein the attachment layer and the dielectric layer are made of substantially the same material.

3. The CMOS circuit of claim 1, wherein the attachment layer has an aperture, and the electrical connection extends through the aperture.

4. The CMOS circuit of claim 1, further comprising a second attachment layer disposed on the first attachment layer, and a second functional device disposed on the second attachment layer.

5. The CMOS circuit of claim 1, wherein the functional device is a carbon nanotube or nanowire.

6. The CMOS circuit of claim 1, wherein the functional device is a carbon nanotube transistor or nanowire transistor.

7. The CMOS circuit of claim 1, wherein the functional device is a magnetic memory device, a phase change memory device, a ferroelectric memory device, or a resistive memory device.

8. The CMOS circuit of claim 1, wherein the functional device is not in contact with the electrically conductive wiring of the wiring layer.

9. The CMOS circuit of claim 1, further comprising an aperture in the first attachment layer and wherein said metallization layer is located in said aperture.

10. The CMOS circuit of claim 1, wherein said metallization layer is in direct contact with said first attachment layer.

11. A complementary metal oxide semiconductor (CMOS) circuit, comprising:
   a) a substrate having CMOS devices;
   b) a wiring layer disposed on the CMOS devices, wherein the wiring layer includes electrically conductive wiring and a dielectric layer;
   c) a first attachment layer bonded to the dielectric layer;
   d) an aperture in the attachment layer;
   e) a bottom surface of a first functional device disposed on and directly contacting the first attachment layer; and
   f) a metallization layer forming an electrical connection between the electrically conductive wiring and the functional device, said metallization layer extending through the aperture,
   wherein the entire functional device is embedded within the first attachment layer.

12. The CMOS circuit of claim 11, wherein the attachment layer and the dielectric layer are made of substantially the same material.

13. The CMOS circuit of claim 11, further comprising a second attachment layer disposed on the first attachment layer, and a second functional device disposed on the second attachment layer.

14. The CMOS circuit of claim 11, wherein the functional device is a carbon nanotube transistor or nanowire transistor.

15. The CMOS circuit of claim 11, wherein the functional device is a magnetic memory device, a phase change memory device, a ferroelectric memory device, or a resistive memory device.

16. The CMOS circuit of claim 11, wherein the functional device is not in contact with the electrically conductive wiring of the wiring layer.

17. The CMOS circuit of claim 11, wherein said metallization layer is located in said aperture.

18. The CMOS circuit of claim 11, wherein said metallization layer is in direct contact with said first attachment layer.

* * * * *